United States Patent
Hsieh

(10) Patent No.: US 9,130,103 B2
(45) Date of Patent: Sep. 8, 2015

(54) LIGHT-EMITTING DIODE DEVICE

(71) Applicant: Phostek, Inc., Taipei (TW)

(72) Inventor: Yen-Chang Hsieh, Hsinchu (TW)

(73) Assignee: PHOSTEK, INC., Hsinchu (TW)

( * ) Notice: Subject to any disclaimer, the term of this patent is extended or adjusted under 35 U.S.C. 154(b) by 287 days.

(21) Appl. No.: 13/678,697

(22) Filed: Nov. 16, 2012

(65) Prior Publication Data

US 2013/0175553 A1 Jul. 11, 2013

(30) Foreign Application Priority Data

Jan. 6, 2012 (TW) .............................. 101100736 A

(51) Int. Cl.
*H01L 33/08* (2010.01)

(52) U.S. Cl.
CPC ...................................... *H01L 33/08* (2013.01)

(58) Field of Classification Search
CPC ..... H01L 33/08; H01L 29/0895; H01L 29/36; H01L 31/076; H01L 25/0753; H01L 33/40; Y02E 10/548
USPC ........ 257/13, 88, 94–103, E27.121, E33.008, 257/59, 79
See application file for complete search history.

(56) References Cited

U.S. PATENT DOCUMENTS

| | | | |
|---|---|---|---|
| 6,153,894 A * | 11/2000 | Udagawa ......................... | 257/96 |
| 6,822,991 B2 | 11/2004 | Collins, III et al. | |
| 6,878,975 B2 | 4/2005 | Hueschen | |
| 6,936,860 B2 * | 8/2005 | Sung et al. ....................... | 257/99 |
| 8,053,331 B2 * | 11/2011 | Gadkaree ........................ | 438/458 |
| 8,487,344 B2 * | 7/2013 | Seong ............................. | 257/184 |
| 8,525,203 B2 | 9/2013 | Tachibana et al. | |
| 8,963,297 B2 * | 2/2015 | Hsieh et al. ..................... | 257/655 |
| 8,980,728 B2 * | 3/2015 | Hsieh et al. ..................... | 438/473 |
| 2002/0013042 A1 * | 1/2002 | Morkoc ........................... | 438/604 |
| 2004/0090779 A1 * | 5/2004 | Ou et al. ......................... | 362/231 |
| 2005/0067627 A1 * | 3/2005 | Shen et al. ....................... | 257/89 |
| 2006/0097269 A1 * | 5/2006 | Lester ............................. | 257/79 |
| 2007/0029555 A1 * | 2/2007 | Lester et al. .................... | 257/79 |
| 2007/0069223 A1 * | 3/2007 | Chen et al. ...................... | 257/88 |
| 2007/0158659 A1 * | 7/2007 | Bensce ............................ | 257/79 |
| 2008/0179587 A1 | 7/2008 | Namkoong et al. | |
| 2008/0303018 A1 | 12/2008 | Kim et al. | |

(Continued)

FOREIGN PATENT DOCUMENTS

| | | |
|---|---|---|
| CN | 101331620 A | 12/2008 |
| CN | 102097553 A | 6/2011 |

(Continued)

OTHER PUBLICATIONS

Chang, Jih-Yuan et al. "Numerical Investigation on the Enhanced Carrier Collection Efficiency of Ga-face GaN/InGaN p-i-n Solar Cells with Polarization Compensation Interlayers." Optics Letters, vol. 36, No. 17, Sep. 1, 2011. pp. 3500-3502.

*Primary Examiner* — Yosef Gebreyesus

(74) *Attorney, Agent, or Firm* — Huffman Law Group, PC

(57) ABSTRACT

The present invention is directed to a light-emitting diode (LED) device, which includes at least one LED unit. Each LED unit includes at least one LED, which includes a first doped layer, a second doped layer and a conductive defect layer. The conductive defect layer is formed on the first or second doped layer. The conductive defect layer may be deposited between two LEDs, or between the first/second doped layer and an electrode.

17 Claims, 3 Drawing Sheets

(56) References Cited

U.S. PATENT DOCUMENTS

| | | | |
|---|---|---|---|
| 2009/0102024 A1* | 4/2009 | Takahi et al. | 257/629 |
| 2009/0272989 A1* | 11/2009 | Shum et al. | 257/89 |
| 2010/0096001 A1* | 4/2010 | Sivananthan et al. | 136/249 |
| 2010/0147361 A1* | 6/2010 | Chen | 136/249 |
| 2010/0224860 A1* | 9/2010 | Ibbetson et al. | 257/13 |
| 2010/0269896 A1 | 10/2010 | Sheng et al. | |
| 2010/0270562 A1* | 10/2010 | Ogihara | 257/77 |
| 2010/0295075 A1* | 11/2010 | Smith et al. | 257/98 |
| 2011/0073902 A1* | 3/2011 | Strassburg et al. | 257/101 |
| 2011/0180781 A1* | 7/2011 | Raring et al. | 257/13 |
| 2011/0198561 A1* | 8/2011 | Tachibana et al. | 257/13 |
| 2011/0204376 A1* | 8/2011 | Su et al. | 257/76 |
| 2012/0012814 A1 | 1/2012 | Harada et al. | |

FOREIGN PATENT DOCUMENTS

| | | |
|---|---|---|
| CN | 102231377 A | 11/2011 |
| TW | 200849548 A | 12/2008 |
| TW | 201031977 A | 9/2010 |
| TW | 201117402 A | 5/2011 |
| TW | 201133587 A | 10/2011 |

* cited by examiner

LIGHT-EMITTING DIODE DEVICE

BACKGROUND OF THE INVENTION

1. Field of the Invention

The present invention generally relates to a light-emitting diode (LED) device, and more particularly to an LED device with a conductive defect layer.

2. Description of Related Art

One common technique of increasing luminescence efficiency of a light-emitting diode (LED) is to use a tunnel junction to stack two or more LEDs. The stacked LEDs emit more light and are brighter than a single LED. The tunnel junction also enhances current spreading, which allows more carriers to perform recombination. Further, the stacked LEDs have fewer electrodes than individual LEDs yielding the same amount of light, therefore saving space and reducing electromigration associated with the electrodes.

One conventional method of forming the tunnel junction is to employ a heavy doping technique, for example, as disclosed in U.S. Pat. No. 6,822,991 entitled "Light Emitting Devices Including Tunnel Junctions." As a tunnel distance of the tunnel junction is usually small, it is ordinarily difficult to obtain an expected tunnel junction by the heavy doping technique. Moreover, heavy doping may disadvantageously affect the doping concentration of a neighboring layer.

Another conventional method of forming the tunnel junction is to employ a polarization technique, for example, as disclosed in U.S. Pat. No. 6,878,975 entitled "Polarization Field Enhanced Tunnel Structures." The polarization technique, however, requires complex process control and unduly limits fabrication material selection.

Another common technique of increasing luminescence efficiency of the LED is by forming an ohmic contact on an electrode. One conventional method of forming the ohmic contact employs the heavy doping technique. The heavy doping, nevertheless, may disadvantageously affect the doping concentration of a neighboring layer.

A need has thus arisen for a novel LED structure to alleviate the problems mentioned above.

SUMMARY OF THE INVENTION

According to one embodiment, a light-emitting diode (LED) device includes one or more LED units, and each of said one or more LED units includes a first LED, a second LED and a conductive defect layer. The conductive defect layer is deposited between the first LED and the second LED, the conductive defect layer acting as a tunnel junction to stack the first LED and the second LED.

According to another embodiment, a light-emitting diode (LED) device comprises one or more LED units, and each said one or more LED units includes a first doped layer, a second doped layer, a conductive defect layer and at least one electrode. The conductive defect layer is deposited on said first doped layer or said second doped layer. The electrode formed on the conductive defect layer, thereby forming an ohmic contact between said at least one electrode and said first doped or the ohmic contact between said at least one electrode and said second doped layer.

The embodiments of the present invention utilize a simpler process and structure to form the tunnel junction or the ohmic contact, which not only increases the luminescence efficiency but also prevents added problems from arising.

DETAILED DESCRIPTION OF THE INVENTION

Figure 1:
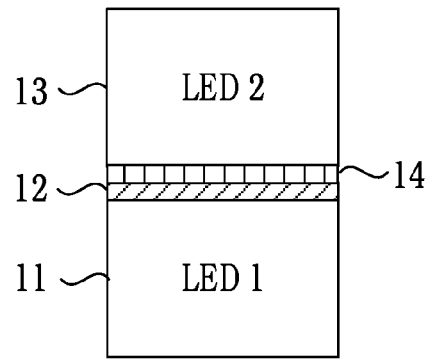
FIG. 1 shows a cross section of a light-emitting diode (LED) device according to a first embodiment of the present invention.

FIG. 1 shows a cross section of a light-emitting diode (LED) device according to a first embodiment of the present invention. The LED device includes at least one LED unit. Each LED unit includes a first LED 11 (LED1) and a second LED 13 (LED2) that are stacked up via a conductive defect layer 12 formed therebetween. The conductive defect layer 12 acts as a tunnel junction, which possesses a low resistance and low optical loss.

Specifically, the first LED 11 has a top surface that faces a bottom surface of the second LED 13. Although two LEDs are exemplified in the embodiment, the embodiment may be modified to stack more than two LEDs.

Figure 2A:
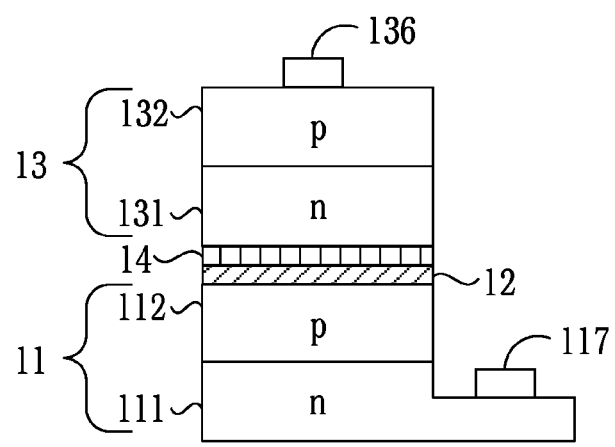
FIG. 2A shows a cross section of FIG. 1, in which both the first LED and the second LED are homojunction structures.

The first LED 11 or the second LED 13 as shown in FIG. 1 may include a homojunction structure or a heterojunction structure. FIG. 2A shows a cross section of FIG. 1, in which both the first LED 11 and the second LED 13 are homojunction structures. Specifically, the first LED 11 includes an n-type doped layer 111 and a p-type doped layer 112, which are made of the same material and thus possess the same energy gap. A p-n junction is formed between the p-type doped layer 112 ad the n-type doped layer 111. Similarly, the second LED 13 primarily includes an n-type doped layer 131 and a p-type doped layer 132. A first electrode 117 is formed on the n-type doped layer 111, and a second electrode 136 is formed on the p-type doped layer 132.

Figure 2B:
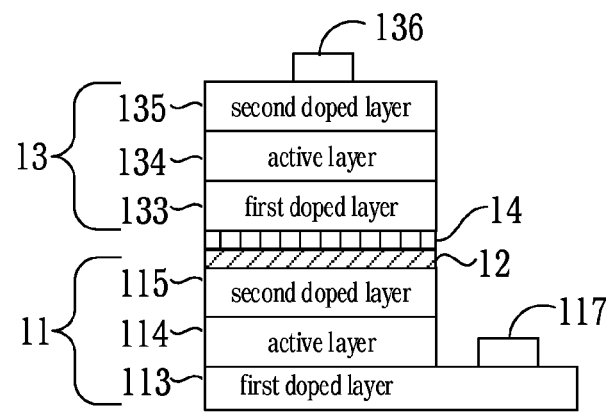
FIG. 2B shows a cross section of FIG. 1, in which both the first LED and the second LED are heterojunction structures.

FIG. 2B shows a cross section of FIG. 1, in which both the first LED 11 and the second LED 13 are heterojunction structures. In an exemplary embodiment, the first LED 11 and/or the second LED 13 is a group III-nitride LED. The first LED 11 primarily includes a first doped layer 113, an active layer 114 and a second doped layer 115. The doped layers 113,115 are made of a material (and thus its associated energy gap) different from that of the active layer 114. Accordingly, carriers can be confined within a well formed in the active layer 114. In an exemplary embodiment, the first doped layer 113 is an n-type doped layer (e.g., made of Gallium Nitride, GaN), the active layer 114 is made of Indium Gallium Nitride (InGaN), and the second doped layer 115 is a p-type doped layer (e.g., made of Gallium Nitride, GaN). Similarly, the second LED 13 primarily includes a first doped layer 133, an active layer 134 and a second doped layer 135. A first electrode 117 is formed on the first doped layer 113, and a second electrode 136 is formed on the second doped layer 135. Henceforth, the structure of FIG. 2B will be referred to in the following embodiments. One skilled in the art will appreciate that the cross sections illustrated in FIG. 2A and FIG. 2B are simplified for illustration purposes, an additional layer or layers may be inserted between any two shown layers when appropriate.

In one embodiment, the active layer 114 of the first LED 11 and the active layer 134 of the second LED 13 may be made of the same material, and thus emit light of the same wavelength. In another embodiment, the active layer 114 of the first LED 11 and the active layer 134 of the second LED 13 may be made of different materials, and thus emit light of different wavelengths. Relevant details may be referred, for example, to U.S. Pat. No. 6,822,991 to Collins et al., entitled "Light emitting devices including tunnel junctions," which is herein incorporated by reference.

In one embodiment, the conductive defect layer 12 may be formed on a top surface of the first LED 11 (e.g., a top surface of the second doped layer 115) by an epitaxy technique. In an exemplary embodiment, the defect density in the conductive defect layer 12 is at least five times the defect density on its growing surface. The growing surface may be a top surface of the first LED 11, or a top surface of an interlayer between the first LED and the conductive defect layer 12. In another embodiment, the defect density in the conductive defect layer 12 is at least two orders of magnitude higher than the defect density on its growing surface. In one embodiment, the conductive defect layer 12 comprises oxide (e.g. silicon oxide), nitride (e.g. silicon nitride, magnesium nitride, gallium nitride, aluminum nitride, indium nitride), oxynitride (e.g. silicon oxynitride), carbide (e.g. silicon carbide), carbon, silicon or metal (e.g. aluminum, gallium). The conductive defect layer 12 may range from a few to tens of nanometer (nm) in thickness. In an exemplary embodiment, the conductive defect layer 12 has a thickness less than or equal to 100 nm.

In some embodiments, the conductive defect layer is discontinuous, such as island-like structure. In some embodiments, the conductive defect layer is non-crystalline structure.

In one embodiment, a defect reduction layer 14 may be further included and formed between the conductive defect layer 12 and the second LED 13. The defect reduction layer 14 is adjacent to the conductive defect layer 12 to yield a defect density, for example, equal to or less than one fifth (⅕) of the defect density on its growing surface. The growing surface may be a top surface of the conductive defect layer 12, or an interface between the conductive defect layer 12 and the defect reduction layer 14. In an exemplary embodiment, the defect density in the defect reduction layer 14 is at least two orders of magnitude lower than the defect density on its growing surface. In one embodiment, the defect reduction layer 14 has a thickness greater than or equal to 10 nm. In another embodiment, the defect reduction layer 14 has a thickness of hundreds of nanometers. Moreover, the defect density of the conductive defect layer 12 may be $10^7$-$10^{21}$/cubic centimeter. The defect reduction layer 14 may be a heterojunction layer, and may include either a single sub-layer or multiple sub-layers.

Figure 3:
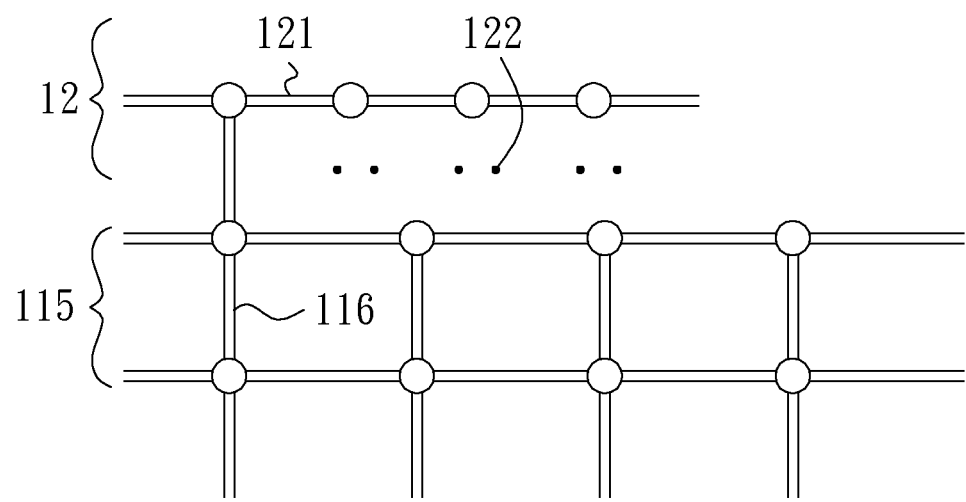
FIG. 3 schematically shows a crystal lattice of the second doped layer and the conductive defect layer of FIG. 2B.

FIG. 3 schematically shows a crystal lattice of the second doped layer 115 and the conductive defect layer 12 of FIG. 2B. Atoms of the second doped layer 115 are bonded by covalent bonds 116, and atoms of the conductive defect layer 12 are also bonded by covalent bonds 121. As the lattice constant of the second doped layer 115 is mismatched with the lattice constant of the conductive defect layer 12, dangling bonds 122 are thus formed between the second doped layer 115 and the conductive defect layer 12. Electrons associated with the dangling bonds are less restrained by their nucleus, therefore resulting in free electrons, which increase polarity of the conductive defect layer 12 and thus form a tunnel junction between the first LED 11 and the second LED 13.

In addition to the epitaxy technique, other techniques may be applied to forming the conductive defect layer 12. For example, a top surface of the first LED 11 (e.g., a top surface of the second doped layer 115) is subject to implantation process, and a conductive defect layer 12 may thus be formed on top surface of the second doped layer 115 by impacting. In some embodiments, other chemical vapor deposition methods or physical vapor deposition methods may also be applied.

In some embodiments, the conductive defect layer 12 comprises a metal based compound; the metal based compound is non-stoichiometric, with excess metal element. In some embodiments, the metal based compound comprises metal oxide, metal nitride, metal oxynitride or metal carbide. In some embodiments, the metal element is in ohmic contact to the first doped layer 113 or the second doped layer 115. In some embodiments, the metal element comprises magnesium, aluminum, gallium or indium. In some embodiments, the conductive defect layer comprises a layer made of the metal based compound and a layer made of oxide, nitride, oxynitride, carbide, carbon, silicon or metal.

Figure 4:
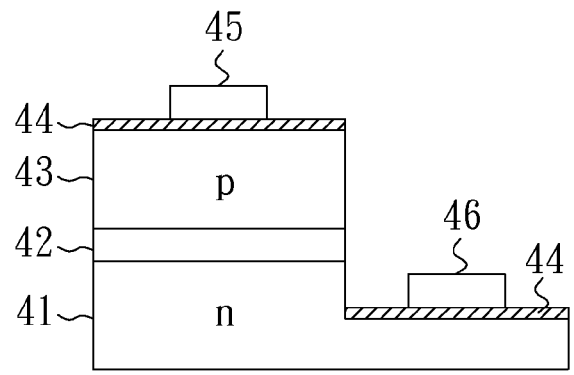
FIG. 4 shows a cross section of an LED device according to a second embodiment of the present invention.

FIG. 4 shows a cross section of an LED device according to a second embodiment of the present invention. As discussed above, the LED may comprise a homojunction structure or a heterojunction structure, as shown in FIG. 2A and FIG. 2B, respectively. In one embodiment, the LED is a group III-nitride LED. The LED includes an n-type doped layer 41, an active layer (or a p-n junction) 42, and a p-type doped layer 43. A conductive defect layer 44 is formed on a surface of the p-type doped layer 43 and/or on the surface of n-type doped layer 41. Subsequently, a p-type electrode 45 or an n-type electrode 46 is formed on the surface of conductive defect layer 44. Accordingly, an ohmic contact may thus be formed between the p-type doped layer 43 and the p-type electrode 45, such that a linear voltage-current relationship may be established. Similarly, an ohmic contact may thus be formed between the n-type doped layer 41 and the n-type electrode 46.

The conductive defect layer 44 may be formed on a surface of the p-type doped layer 43 and/or the n-type doped layer 41. Similar to the first embodiment, the defect density in the conductive defect layer 44 is preferably at least five times the defect density on its growing surface. Such a high defect density may therefore provide conductivity. In another embodiment, the defect density in the conductive defect layer 44 is preferably at least two orders of magnitude higher than the defect density on its growing surface. In one embodiment, the conductive defect layer 44 may be made of a material such as, but not limited to, Silicon Nitride (SiN), metal (e.g., Gallium (Ga), Aluminum (Al) or Indium (In)), Silicon Carbide (SiC) or Silicon (Si). The conductive defect layer 44 may range from a few to tens of nanometers (nm) in thickness. In an exemplary embodiment, the conductive defect layer 44 has a thickness less than or equal to 100 nm.

Figure 5:
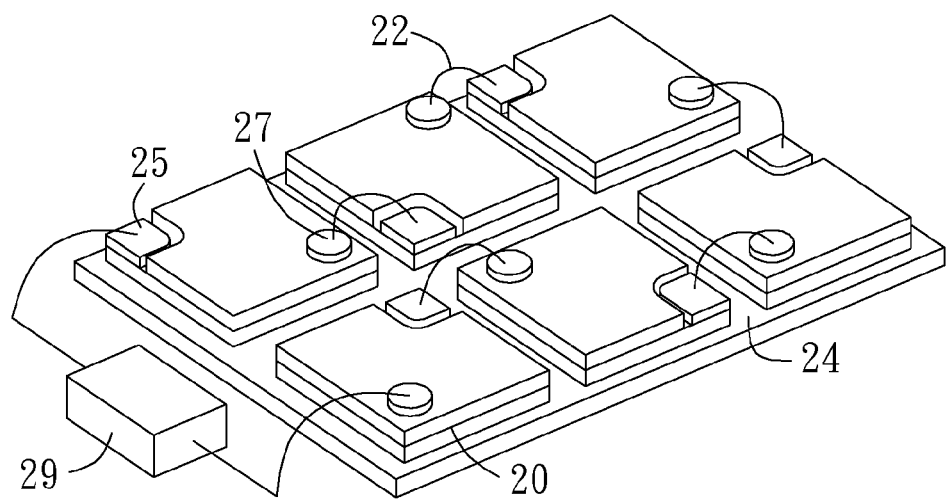
FIG. 5 shows a perspective diagram illustrating an LED device.

FIG. 5 shows a perspective diagram illustrating an LED device, which includes a plurality of LED units 20 that are arranged on a substrate 24 in an array form. The LED device as shown in FIG. 5 may therefore be called a LED array. A first electrode 25 and a second electrode 27 of neighboring LED units 20 are electrically connected, via a solder wire 22 or an interconnect line, thereby resulting in a series or parallel connected sequence of the LED units. Taking the serial connected sequence as an example, the first electrode 25 of the most front LED unit 20 and the second electrode 27 of the most rear LED unit 20 in the sequence are respectively connected to two ends of a power supply 29. The LED unit 20 as shown in FIG. 5 may be the stacked LEDs of FIG. 1 (the first embodiment) or the single LED of FIG. 4 (the second embodiment).

Although specific embodiments have been illustrated and described, it will be appreciated by those skilled in the art that various modifications may be made without departing from the scope of the present invention, which is intended to be limited solely by the appended claims.

What is claimed is:

1. A light-emitting diode (LED) device, including one or more LED units, each of said one or more LED units comprising:
   a first LED and a second LED; and
   a conductive defect layer deposited between said first LED and said second LED, said conductive defect layer acting as a tunnel junction to stack said first LED and said second LED;
   wherein said conductive defect layer comprises a metal based compound, said metal based compound is non-stoichiometric, with excess metal element.

2. The LED device of claim 1, wherein said first LED and/or said second LED comprises a group III-nitride LED, and wherein said first LED or said second LED comprises:
   a first doped layer;
   a second doped layer having a second conductivity opposite to a first conductivity of said first doped layer;
   an active layer deposited between said first doped layer and said second doped layer;
   wherein said second doped layer of said first LED is stacked with said first doped layer of said second LED via said conductive defect layer.

3. The LED device of claim 1, wherein said conductive defect layer comprises oxide, nitride, oxynitride, carbide, carbon, silicon or metal.

4. The LED device of claim 1, wherein said conductive defect layer comprises silicon oxide, silicon nitride, magnesium nitride, gallium nitride, aluminum nitride, indium nitride, silicon oxynitride, silicon carbide, aluminum, or gallium.

5. The LED device of claim 1, wherein a plurality of said one or more LED units are arranged in an array form, and wherein each of said plurality of said one or more LED units comprises a first electrode and a second electrode, and wherein the first electrode and/or the second electrode of neighboring LED units are electrically connected, thereby resulting in a series or parallel connected sequence of the LED units.

6. A light-emitting diode (LED) device, including one or more LED units, each of said one or more LED units comprising:
   a first LED and a second LED; and
   a conductive defect layer deposited between said first LED and said second LED, said conductive defect layer acting as a tunnel junction to stack said first LED and said second LED;
   wherein a first defect density in said conductive defect layer is at least five times a second defect density on a growing surface of the conductive defect layer, and said conductive defect layer has a thickness less than or equal to 100 nm.

7. The LED device of claim 6, wherein said conductive defect layer is non-crystalline structure.

8. The LED device of claim 6, wherein said conductive defect layer is formed by chemical vapor deposition, physical vapor deposition or implantation.

9. A light-emitting diode (LED) device, including one or more LED units, each of said one or more LED units comprising:
   a first LED and a second LED; and
   a conductive defect layer deposited between said first LED and said second LED, said conductive defect layer acting as a tunnel junction to stack said first LED and said second LED;
   further comprising a defect reduction layer deposited between said conductive defect layer and said second LED, said defect reduction layer being adjacent to said conductive defect layer to yield a first defect density equal to or less than one fifth (1/5) of a second defect density on a growing surface of the defect reduction layer, and said defect reduction layer has a thickness greater than or equal to 10 nm.

10. The LED device of claim 9, wherein said metal based compound comprises metal oxide, metal nitride, metal oxynitride or metal carbide.

11. The LED device of claim 9, wherein the metal element comprises magnesium, aluminum, gallium or indium.

12. The LED device of claim 9, wherein said conductive defect layer comprises a layer made of said metal based compound and a layer made of oxide, nitride, oxynitride, carbide, carbon, silicon or metal.

13. A light-emitting diode (LED) device, comprising one or more LED units, each said one or more LED units comprising:
   a first doped layer;
   a second doped layer having a first conductivity opposite to a second conductivity of said first doped layer;
   a conductive defect layer deposited on said first doped layer or said second doped layer; and
   at least one electrode formed on the conductive defect layer, thereby forming an ohmic contact between said at least one electrode and said first doped or the ohmic contact between said at least one electrode and said second doped layer;
   wherein a first defect density in said conductive defect layer is at least five times a second defect density on a growing surface of the conductive defect layer, and wherein said conductive defect layer has a thickness less than or equal to 100 nm.

14. The LED device of claim 13, further comprising an active layer formed between said first doped layer and said second doped layer, the LED device being a group III-nitride LED.

15. The LED device of claim 13, wherein said conductive defect layer comprises oxide, nitride, oxynitride, carbide, carbon, silicon or metal.

16. The LED device of claim 13, wherein said conductive defect layer is non-crystalline structure.

17. A light-emitting diode (LED) device, comprising one or more LED units, each said one or more LED units comprising:
   a first doped layer;
   a second doped layer having a first conductivity opposite to a second conductivity of said first doped layer;
   a conductive defect layer deposited on said first doped layer or said second doped layer; and
   at least one electrode formed on the conductive defect layer, thereby forming an ohmic contact between said at least one electrode and said first doped or the ohmic contact between said at least one electrode and said second doped layer;
   wherein said conductive defect layer comprises a metal based compound, said metal based compound is non-stoichiometric, with excess metal element.

* * * * *